(12) United States Patent
Nagakura et al.

(10) Patent No.: US 10,910,229 B2
(45) Date of Patent: Feb. 2, 2021

(54) SUBSTRATE TREATMENT METHOD

(71) Applicant: TOKYO ELECTRON LIMITED, Tokyo (JP)

(72) Inventors: Koichi Nagakura, Yamanashi (JP); Tamotsu Morimoto, Yamanashi (JP); Shuichiro Uda, Yamanashi (JP); Takeshi Saito, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/065,462

(22) PCT Filed: Nov. 21, 2016

(86) PCT No.: PCT/JP2016/084379
§ 371 (c)(1),
(2) Date: Jun. 22, 2018

(87) PCT Pub. No.: WO2017/110335
PCT Pub. Date: Jun. 29, 2017

(65) Prior Publication Data
US 2018/0366334 A1    Dec. 20, 2018

(30) Foreign Application Priority Data

Dec. 25, 2015 (JP) ................... 2015-253439

(51) Int. Cl.
| | |
|---|---|
| *H01L 21/3065* | (2006.01) |
| *H05H 1/46* | (2006.01) |
| *H01L 21/02* | (2006.01) |
| *H01L 21/28* | (2006.01) |
| *H01L 21/311* | (2006.01) |
| *H01L 21/3105* | (2006.01) |
| *H01L 29/78* | (2006.01) |

(52) U.S. Cl.
CPC ...... *H01L 21/3065* (2013.01); *H01L 21/0206* (2013.01); *H01L 21/02252* (2013.01);
(Continued)

(58) Field of Classification Search
CPC .......... H01L 21/3065; H01L 21/31116; H01L 21/3105; H01L 21/28185; H01L 21/0206;
(Continued)

(56) References Cited

U.S. PATENT DOCUMENTS

| | | | |
|---|---|---|---|
| 9,177,853 B1 * | 11/2015 | Futase | ............... H01L 21/31116 |
| 2002/0002942 A1 * | 1/2002 | Abraham | ................ C30B 33/00 |
| | | | 117/97 |

(Continued)

FOREIGN PATENT DOCUMENTS

| | | |
|---|---|---|
| JP | 56-51580 A | 5/1981 |
| JP | 5-109883 A | 4/1993 |

(Continued)

OTHER PUBLICATIONS

International Search Report dated Feb. 14, 2017 issued in corresponding International Application No. PCT/JP2016/084379.

*Primary Examiner* — Anita K Alanko
(74) *Attorney, Agent, or Firm* — Nath, Goldberg & Meyer; Jerald L. Meyer

(57) ABSTRACT

A method capable of increasing a degree of freedom of process conditions that can be set in a plasma treatment while limiting deterioration in the electrical characteristics of a silicon or metal oxide film exposed to plasma, in performing the plasma treatment on a substrate. The method includes: processing a substrate on which a silicon or metal oxide film is formed, with plasma obtained by plasmarizing a process gas composed of a halogen compound; and subsequently, heating the substrate at a temperature of 450 degrees C. or higher in an inert gas atmosphere or a vacuum atmosphere in a state where the metal oxide film exposed to the plasma is exposed. Thus, deterioration in the characteristics of the oxide film caused by the plasma treatment are restored.

6 Claims, 15 Drawing Sheets

(52) U.S. Cl.
 CPC .... *H01L 21/28185* (2013.01); *H01L 21/3105* (2013.01); *H01L 21/31116* (2013.01); *H01L 29/78* (2013.01); *H05H 1/46* (2013.01); *H01J 2237/334* (2013.01)

(58) Field of Classification Search
 CPC ..... H01L 21/02252; H01L 29/78; H05H 1/46; H01J 2237/334
 See application file for complete search history.

(56) References Cited

U.S. PATENT DOCUMENTS

| | | | | |
|---|---|---|---|---|
| 2003/0211748 | A1* | 11/2003 | Jin | H01L 21/31122 438/709 |
| 2008/0038922 | A1* | 2/2008 | Lamers | B81C 1/00595 438/694 |
| 2008/0182382 | A1* | 7/2008 | Ingle | H01L 21/3105 438/435 |
| 2010/0197143 | A1* | 8/2010 | Nishimura | H01L 21/31116 438/734 |
| 2015/0214101 | A1* | 7/2015 | Ren | H01L 21/3065 438/704 |
| 2016/0079081 | A1* | 3/2016 | Toda | H01L 21/30604 216/79 |
| 2016/0086814 | A1* | 3/2016 | Takahashi | H01L 21/31116 438/724 |

FOREIGN PATENT DOCUMENTS

| | | |
|---|---|---|
| JP | H10-321847 A | 12/1998 |
| JP | 2003-264183 A | 9/2003 |

* cited by examiner

SUBSTRATE TREATMENT METHOD

TECHNICAL FIELD

The present disclosure relates to a method of processing a surface of a substrate with plasma.

BACKGROUND

In some cases, a semiconductor manufacturing process may include a process of forming a silicon nitride (SiN) film as a portion of an insulating film or a hard mask on a semiconductor wafer (hereinafter referred simply to as "wafer") as a substrate and then removing the formed SiN film. For example, the removal of the SiN film may be performed by etching with plasma obtained by plasmarizing a process gas containing a halogen compound. Patent Document 1 discloses such a plasma-based etching.

PRIOR ART DOCUMENTS

Patent Documents

Patent Document 1: Japanese laid-open publication No. 2003-264183

In addition to the silicon nitride (SIN) film, a silicon oxide ($SiO_2$) film constituting, for example, a gate oxide film of a transistor may sometimes be formed as a base of the SiN film on the wafer. In such a case, if the SiN film is removed by the above-mentioned plasma-based etching, the $SiO_2$ film may be exposed to the plasma, which may result in deterioration in the electrical characteristics of the $SiO_2$ film, such as a decrease in dielectric withstanding voltage and an increase in leakage current of the $SiO_2$ film. By appropriately setting various process conditions such as a flow rate of a process gas, an atmospheric pressure with which the etching is performed, power supplied to a high frequency power supply for forming the plasma, and the like, it is possible to suppress the deterioration in the electric characteristics of the $SiO_2$ film. However, when the process conditions are set so as to suppress such deterioration in the electrical characteristics, an etching rate and an etching selectivity of the SiN film to the $SiO_2$ film decrease. That is to say, a level of etching rate and selectivity, and a degree of limiting deterioration in the electrical characteristics of the $SiO_2$ film are in a trade-off relationship.

SUMMARY

The present disclosure provides some embodiments of a technique capable of increasing a degree of freedom of process conditions that can be set in a plasma treatment while limiting deterioration in the electrical characteristics of a silicon or metal oxide film exposed to plasma, in performing the plasma treatment on a substrate.

According to one embodiment of the present disclosure, there is provided a method of processing a substrate, including: processing a substrate on which a silicon or metal oxide film is formed, with plasma obtained by plasmarizing a process gas composed of a halogen compound; and subsequently, heating the substrate at a temperature of 450 degrees C. or higher in an inert gas atmosphere or a vacuum atmosphere in a state where the metal oxide film exposed to the plasma is exposed.

According to the present disclosure, after subjecting a substrate to plasma treatment, the substrate is heated to 450 degrees C. or higher in an inert gas atmosphere or a vacuum atmosphere in a state where a silicon or metal oxide film is exposed. Thus, deterioration in the electrical characteristics of the oxide film caused by the plasma treatment can be restored. Therefore, it is possible to increase a degree of freedom of process conditions that can be set to perform the plasma treatment while limiting deterioration in the electrical characteristics of the oxide film.

DETAILED DESCRIPTION

Figure 1:
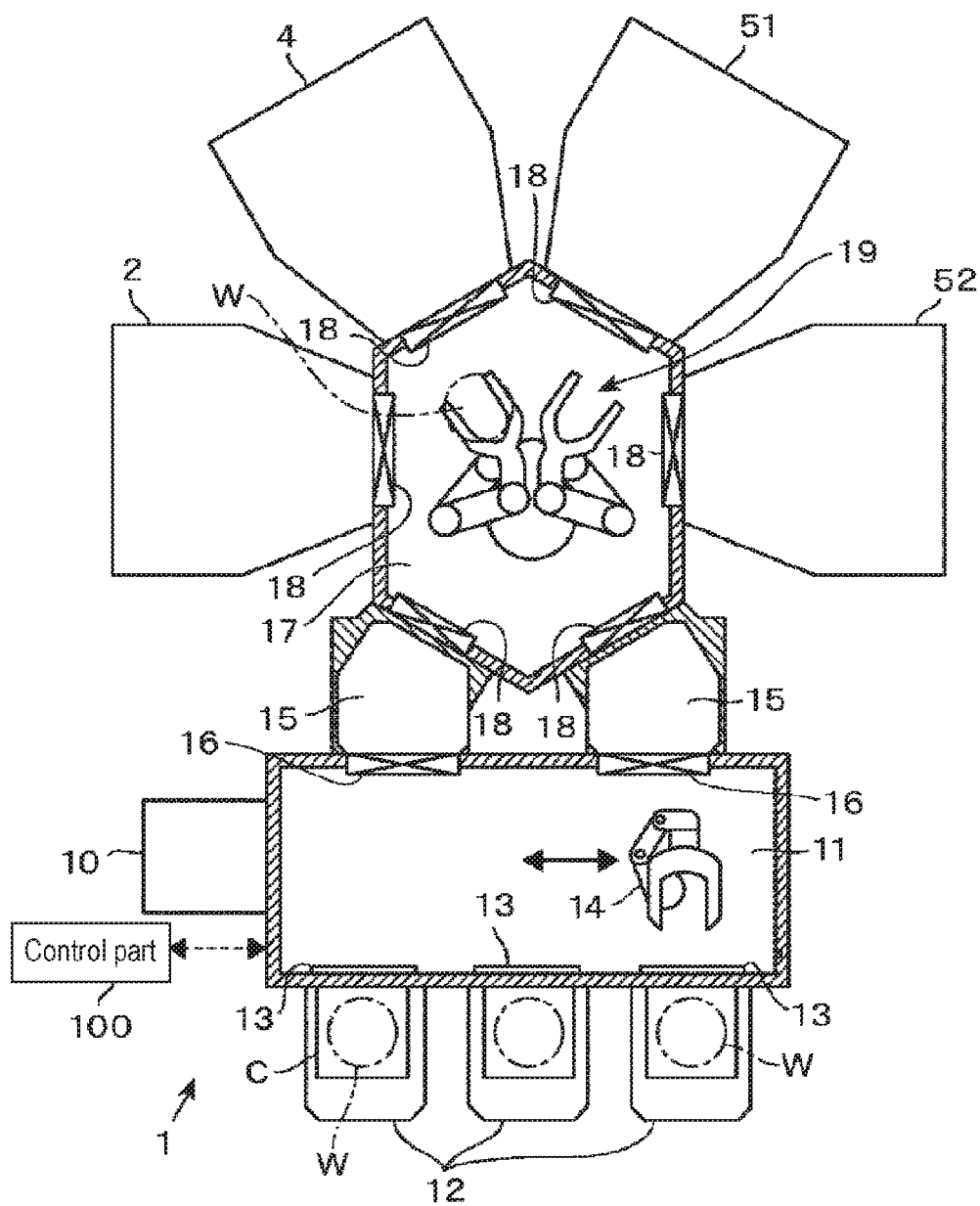
FIG. 1 is a plan view of a semiconductor manufacturing apparatus used to carry out the present disclosure.

One embodiment of a semiconductor manufacturing apparatus 1 which is an apparatus used to carry out a substrate processing method of the present disclosure will now be described with reference to a plan view of FIG. 1. The semiconductor manufacturing apparatus 1 is provided with a horizontally-elongated normal pressure transfer chamber 11 which is brought to a normal pressure atmosphere by, for example, a $N_2$ gas. Load ports 12 are installed in front of the normal pressure transfer chamber 11. Transfer containers C, each of which accommodates a wafer W as a substrate, are mounted on the respective load ports 12. Opening/closing doors 13, which are configured to be opened and closed together with lids (not shown) installed in the respective transfer containers C, are installed in the front wall of the normal pressure transfer chamber 11. A first transfer arm 14 constituted by an articulated arm for transferring the wafer W is installed within the normal pressure transfer chamber 11. An alignment chamber 10, in which an orientation and eccentricity of the wafer W is adjusted, is installed in a left wall of the normal pressure transfer chamber 11 when viewed from the load port 12.

For example, two load lock chambers 15 are arranged at the left and right sides facing the load ports 12 in the normal pressure transfer chamber 11. Each of the load lock chambers 15 switches an internal atmosphere between the normal pressure atmosphere and a vacuum atmosphere in a state where the wafer W is kept in standby. The load lock chambers 15 are partitioned from each other by respective door valves 16. The first transfer arm 14 serves to deliver the wafer W among the transfer containers C, the alignment chamber 10 and the load lock chambers 15. A vacuum transfer chamber 17 is disposed inward of the load lock chambers 15 via gate valves 18 when viewed from the normal pressure transfer chamber 11.

The vacuum transfer chamber 17 is connected to the load lock chambers 15, an etching module 2, a nitrogen annealing module 4, a film forming module 51 and a hydrogen annealing module 52 via respective gate valves 18. A second transfer arm 19, which is an articulated arm, is installed within the vacuum transfer chamber 17 and delivers the wafer W between the load lock chambers 15 and the modules 2, 4, 51 and 52. The vacuum transfer chamber 17 is connected to a vacuum exhaust mechanism (not shown) through an exhaust pipe installed in a bottom surface of the vacuum transfer chamber 17. The interior of the vacuum transfer chamber 17 is vacuum-exhausted by the vacuum exhaust mechanism so that the vacuum transfer chamber 17 is kept in a nitrogen gas atmosphere by a nitrogen gas supply mechanism (not shown).

Figure 2:
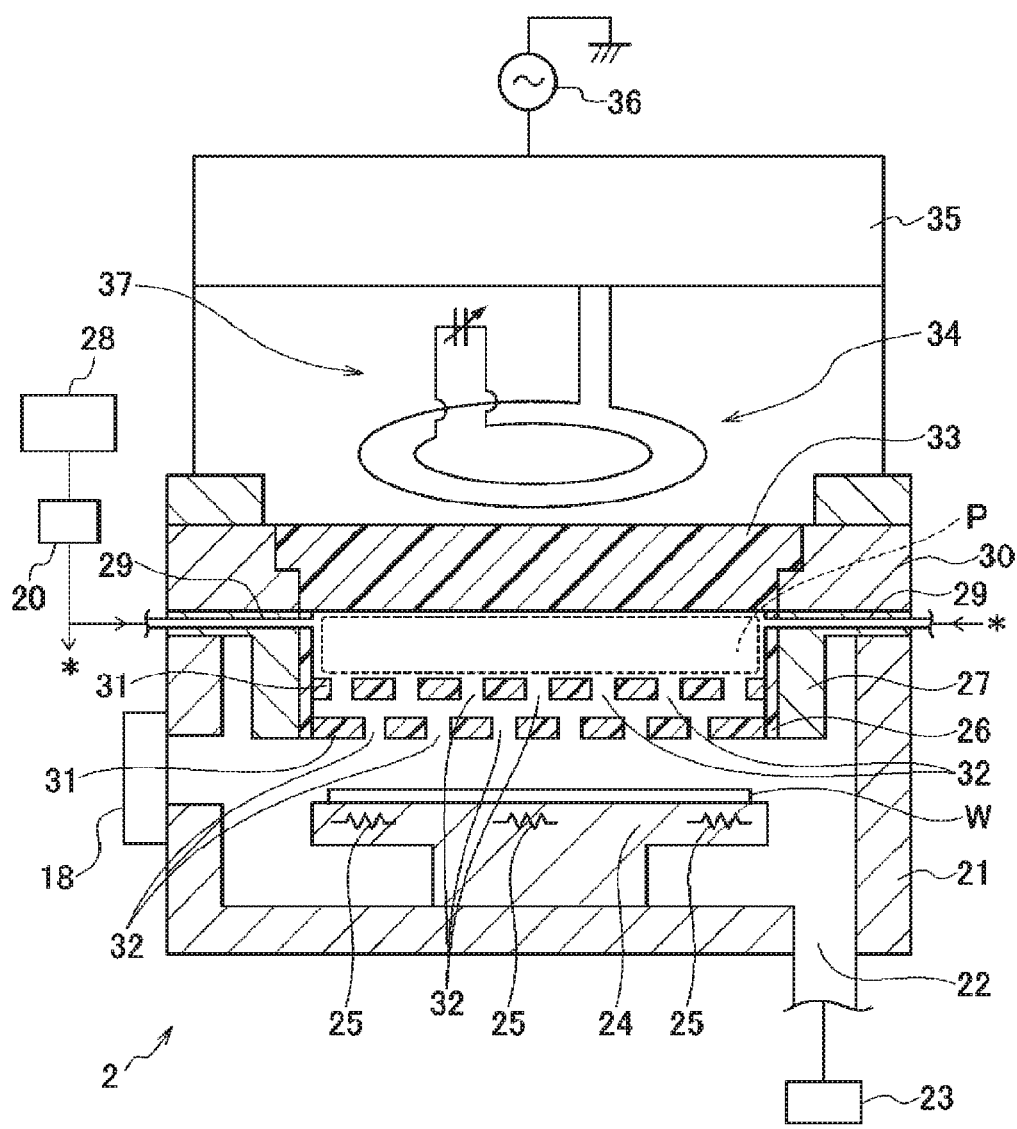
FIG. 2 is a schematic longitudinal sectional side view of an etching module included in the semiconductor manufacturing apparatus.

Next, the etching module 2 will be described with reference to the longitudinal sectional side view of FIG. 2. The etching module 2 forms ICP (inductively-coupled plasma) to etch the surface of the wafer W. In FIG. 2, reference numeral 21 denotes a vacuum container, which is connected to the vacuum transfer chamber 17 via one of the respective, above-mentioned gate valves 18. An exhaust port 22 is opened in the bottom portion of the vacuum container 21. The exhaust port 22 is connected to a vacuum exhaust mechanism 23 which exhausts the interior of the vacuum container 21 to form a vacuum atmosphere. In FIG. 2, reference numeral 24 denotes a stage on which the wafer W is horizontally mounted in a horizontal posture inside the vacuum container 21. The stage 24 includes a heater 25 for heating the wafer W. In addition, the stage 24 includes lift pins (not shown) which move upward and downward from the surface of the stage 24 to deliver the wafer W with the second transfer arm 19.

A cylindrical quartz-made plasma generating part 26 is installed to extend upward within the vacuum container 21. In FIG. 2, reference numeral 27 denotes an outer cylindrical part which surrounds the outer circumference of the plasma generating part 26 and supports the plasma generating part 26 above the stage 24. The outer cylindrical part 27 is supported on the side wall of the vacuum container 21 by a flange formed in an upper portion of the outer cylindrical part 27. In FIG. 2, reference numeral 28 denotes a gas supply source installed outside the vacuum container 21. The gas supply source 28 supplies a mixed gas of a fluorine compound gas, an argon (Ar) gas and an oxygen ($O_2$) gas to a plasma formation region P defined in an inner upper portion of the plasma generating part 26 via a gas passage 29 extending from the outer cylindrical part 27 to the plasma generating part 26. The fluorine compound gas is a gas used to etch a SiN film (to be described later). The $O_2$ gas is a gas used to increase an etching selectivity of the SiN film. In FIG. 2, reference numeral 20 denotes a gas supply device constituted by a valve or a mass flow controller. The gas supply device 20 adjusts a flow rate of a gas supplied from the gas supply source 28 to the gas passage 29.

A plurality of flat ion trap plates 31 made of quartz is installed in an inner lower portion of the plasma generating part 26 in plural stages at vertical intervals so as to close an opening of the plasma generating part 26. Although in FIG. 2, the ion trap plates 31 are shown to be installed in a set of upper and lower stages, the number of stages is not limited thereto. In FIG. 2, reference numeral 32 denotes a plurality of through-holes formed in each of the ion trap plates 31. The through-holes 32 formed in the upper ion trap plate 31 and the through-holes 32 formed in the lower ion trap plate 31 are formed at positions that deviate from each other so that radicals can be supplied onto the wafer W by trapping ions among the ions and radicals constituting the plasma generated in the plasma formation region P. That is to say, the through-holes 32 of the upper ion trap plate 31 and the through-holes 32 of the lower ion trap plate 31 do not overlap with each other.

In FIG. 2, reference numeral 33 denotes a top plate of the vacuum container 21, which is made of quartz and is installed so as to close the opening of the plasma generating part 26 from above. In FIG. 2, reference numeral 30 denotes a support part for supporting a peripheral portion of the top plate 33 in the side wall of the vacuum container 21. An antenna 34 is installed within a housing disposed on the top plate 33. The antenna 34 is connected via a matching device 35 to a high frequency power supply 36 for supplying a high frequency of, e.g., 13.56 MHz, and is provided to form ICP in the plasma formation region P. In FIG. 2, reference numeral 37 denotes a coil having a variable capacitance capacitor. The coil 37 is disposed so as to form ICP in the plasma formation region P, similar to the antenna 34, when an induced current flows into the coil 37 due to the action of magnetic flux lines generated from the antenna 34. The coil 37 serves to form ICP with high uniformity in the plasma formation region P in cooperation with the antenna 34.

Figure 3:
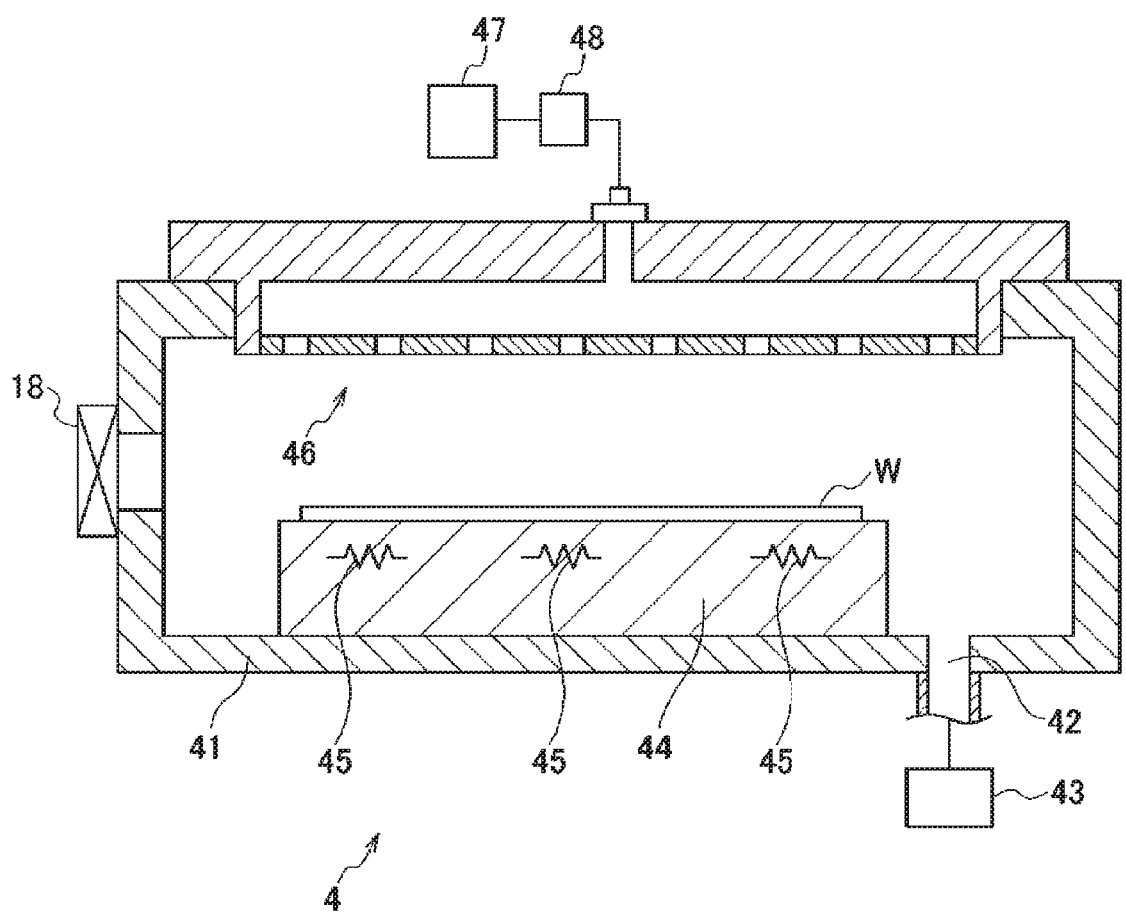
FIG. 3 is a longitudinal sectional side view of a nitrogen annealing module included in the semiconductor manufacturing apparatus.

Next, the nitrogen annealing module 4 will be described with reference to the longitudinal sectional side view of FIG. 3. In FIG. 3, reference numeral 41 denotes a vacuum container which is connected to the vacuum transfer chamber 17 via the respective gate valve 18. An exhaust port 42 is opened in a bottom portion of the vacuum container 41 and is connected to a vacuum exhaust mechanism 43 for exhausting the interior of the vacuum container 41 to form a vacuum atmosphere. In FIG. 3, reference numeral 44 denotes a stage disposed inside the vacuum container 41 and for mounting the wafer W thereon. The stage 44 includes a heater 45 for heating the mounted wafer W to a temperature within a range to be described later. The stage 44 includes lift pins (not shown) which are moved up and down on the surface of the stage 44 to deliver the wafer W with the second transfer arm 19.

A shower head 46 connected to a nitrogen ($N_2$) gas supply source 47 is installed above the stage 44. The shower head 46 supplies a $N_2$ gas to the wafer W mounted on the stage 44 in the form of a shower, thus forming a $N_2$ gas atmosphere around the wafer W. More specifically, a vacuum atmosphere in which the $N_2$ gas is contained can be formed inside the vacuum container 41 by the exhaust from the exhaust port 42 and the supply of the $N_2$ gas from the shower head 46. In FIG. 3, reference numeral 48 denotes a gas supply device constituted by a valve or a mass flow controller. The gas supply device 48 adjusts a flow rate of a gas supplied from the gas supply source 47 to the shower head 46.

Next, the film forming module 51 and the hydrogen annealing module 52 will be briefly described. These modules 51 and 52 have substantially the same configuration as the nitrogen annealing module 4, for example. The film forming module 51 is different from the nitrogen annealing module 4 in that the film forming module 51 is configured to discharge an aluminum (Al)-containing gas, instead of the $N_2$ gas, from the shower head 46 to form an Al film on the surface of the wafer W by CVD (Chemical Vapor Deposition). However, the film forming module 51 may be configured to form the Al film by PVD (Physical Vapor Deposition). The hydrogen annealing module 52 is different from the nitrogen annealing module 4 in that the hydrogen annealing module 52 is configured to supply a hydrogen ($H_2$) gas, instead of the $N_2$ gas, from the shower head 46 to form a hydrogen gas atmosphere.

Referring back to FIG. 1, the semiconductor manufacturing apparatus 1 includes a control part 100 composed of a computer. The control part 100 has a program. The program incorporates a group of steps organized so as to execute a series of operations which is involved in the operation of the semiconductor manufacturing apparatus 1 to be described later. In accordance with the program, the control part 100 outputs control signals to various parts of the semiconductor manufacturing apparatus 1 so as to control the transfer of the wafer W by the transfer arms 14 and 19, the internal pressures of the vacuum containers 21 and 41 by the vacuum exhaust mechanisms 23 and 43 in each module, the temperature of the wafer W heated by the heaters 25 and 45 of each module, the flow rates of gases supplied to the wafer W by the gas supply devices 20 and 48, and the like. This program is stored in a computer-readable storage medium, for example, a flexible disk, a compact disk, a hard disk, a magneto-optical disk or the like, and is installed on the control part 100.

Next, the operation of the semiconductor manufacturing apparatus 1 will be described with reference to the flowchart of FIG. 4 as appropriate. FIG. 5 is a longitudinal sectional side view of a wafer W processed by the semiconductor manufacturing apparatus 1, illustrating a surface structure of the wafer W during a CMOS (Complementary Metal Oxide Semiconductor) manufacturing process. In this surface structure, an insulating film 64 is buried between convex patterns 62 of a silicon layer 61 via a barrier layer 63. A $SiO_2$ film 65 and a SiN film 66 formed on the $SiO_2$ film 65 are stacked on the convex patterns 62. The $SiO_2$ film 65 is an insulating film used as a gate oxide film of the transistor.

After the wafer W having the surface structure of FIG. 5 is transferred from the transfer container C to the normal pressure transfer chamber 11, the alignment chamber 10, the normal pressure transfer chamber 11, the load lock chamber 15 and the vacuum transfer chamber 17 in this order. Thereafter, the wafer W is mounted on the stage 24 of the etching module 2 where the wafer W is heated to a predetermined temperature. In the meantime, the gate valve 18 of the vacuum container 21 of the etching module 2 is closed and the interior of the vacuum container 21 is sealed and exhausted to form a vacuum atmosphere of a predetermined pressure. Thereafter, the fluorine compound gas, the Ar gas and the $O_2$ gas are supplied to the plasma generating part 26 and a high frequency power is applied to the antenna 34. Thus, these gases are plasmarized in the plasma formation region P of the plasma generating part 26. Then, radicals constituting the plasma are supplied onto the wafer W to etch the SiN film 66 (step S1). This etching is performed to selectively remove the SiN film 66 and expose the $SiO_2$ film 65 to the plasma.

Figure 6:
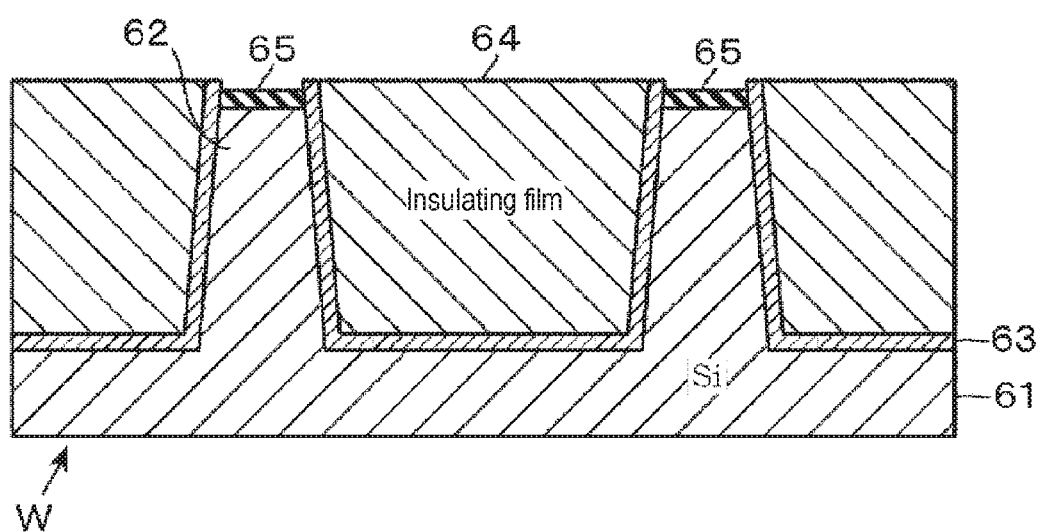
FIG. 6 is a schematic view illustrating a surface of the wafer.

After the removal of the SiN film 66, the formation of plasma is stopped. The temperature of the wafer W is increased up to, for example, 200 degrees C. to 240 degrees C., so that ammonium fluorosilicate, which is by-products generated by the etching from the surface of the $SiO_2$ film 65, is removed by sublimation. FIG. 6 illustrates the wafer W from which by-products have been removed in this way. Thereafter, the wafer W is transferred to the nitrogen annealing module 4 and is mounted on the stage 44 of the nitrogen annealing module 4. The gate valve 18 of the module 4 is closed. A $N_2$ gas is supplied into the vacuum container 41, and the interior of the module 4 is exhausted to form a vacuum atmosphere of a predetermined pressure, which contains the $N_2$ gas. In the meantime, the wafer W is heated to a temperature of 450 degrees C. or higher by the heater 45 of the stage 44, thus being subjected to annealing (step S2).

The reason why the processing in the nitrogen annealing module 4 is performed in this manner will be described below. As described above, in the etching module 2, the $SiO_2$ film 65 is exposed to the plasma. As described in the Background section of the present disclosure, the exposure of the $SiO_2$ film 65 to the plasma causes a decrease in dielectric withstanding voltage and an increase in leakage current of the film. It is believed that this is because fluorines (F and $F_2$) generated from active species of the plasma and water ($H_2O$) generated by the plasma treatment enter into the surface of the $SiO_2$ film 65, as will be described in detail in Evaluation tests to be described later.

Therefore, in the nitrogen annealing module 4, by heating the wafer W in a state in which the $SiO_2$ film 65 is exposed from the surface of the wafer W, namely in a state where the $SiO_2$ film 65 is not covered with another film, fluorine and water are desorbed from the $SiO_2$ film 65 into the atmosphere around the wafer W. From the results of the Evaluation tests to be described later, a temperature of the wafer W at which the desorption is generated is set to 450 degrees C. or higher. In addition, when the temperature of the wafer W is 500 degrees C. or higher, the desorption may be reliably generated. When the temperature of the wafer W is 600 degrees C. or higher, the desorption may be generated in a relatively short period of time.

In this example, it is assumed that the wafer W is heated and annealed at 600 degrees C. for 10 minutes in the nitrogen annealing module 4. Then, the annealed wafer W is transferred to the film forming module 51 where an Al film as an electrode (conductive film) is formed so as to cover the surface of the wafer W. That is to say, the Al film is formed so as to be laminated on the $SiO_2$ film 65 (step S3). Subsequently, the wafer W is transferred to the hydrogen annealing module 52 where the wafer W is heated and annealed at, for example, 400 degrees C. for 10 minutes in a hydrogen atmosphere (step S4). Thereafter, the wafer W is transferred to the vacuum transfer chamber 17, the load lock chamber 15 and the normal pressure transfer chamber 11 in this order and is returned to the transfer container C.

According to the semiconductor manufacturing apparatus 1, after the SiN film 66 is plasma-etched in the etching module 2, the wafer W with the exposed $SiO_2$ film 65 is heated to a temperature of 450 degrees C. or higher in the nitrogen gas atmosphere in the nitrogen annealing module 4. Therefore, it is possible to restore the electrical characteristics of the $SiO_2$ film 65 deteriorated by the plasma etching, specifically, the characteristics of the dielectric withstanding voltage and the leakage current of the $SiO_2$ film 65. Therefore, when the plasma etching is performed, it is unnecessary to select process conditions of a low etching rate of the SiN film 66 and a low etching selectivity of the SiN film 66 in order to avoid the deterioration in the electrical characteristics of the $SiO_2$ film 65. In other words, the degree of freedom of various process conditions that can be set n the plasma etching increases, thereby achieving both the increase of the etching rate and selectivity for the plasma etching of the SiN film 66 and the improvement of the electrical characteristics of the $SiO_2$ film 65.

Figure 4:
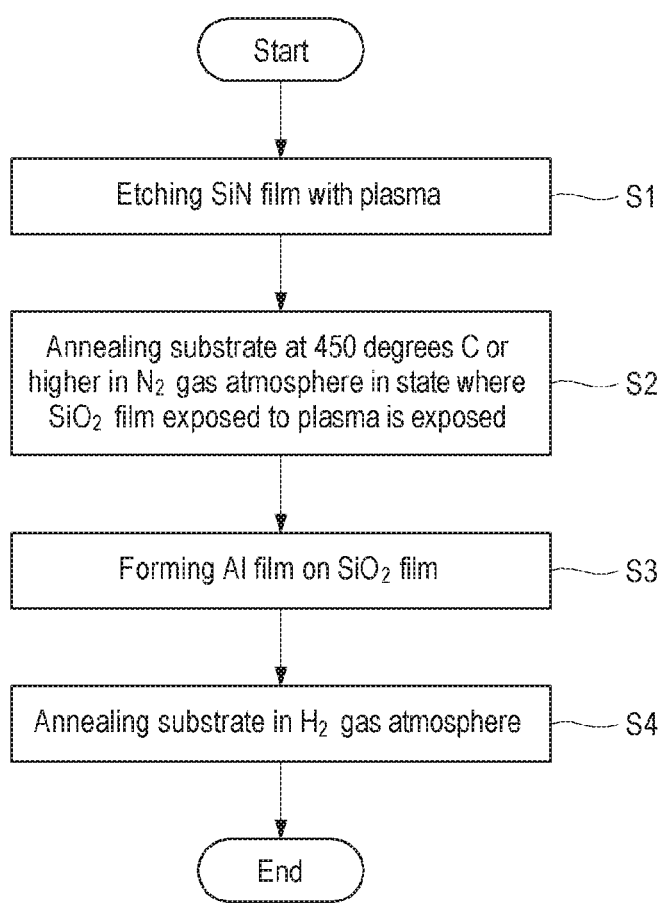
FIG. 4 is a flowchart illustrating processing steps performed by the semiconductor manufacturing apparatus.
Figure 5:
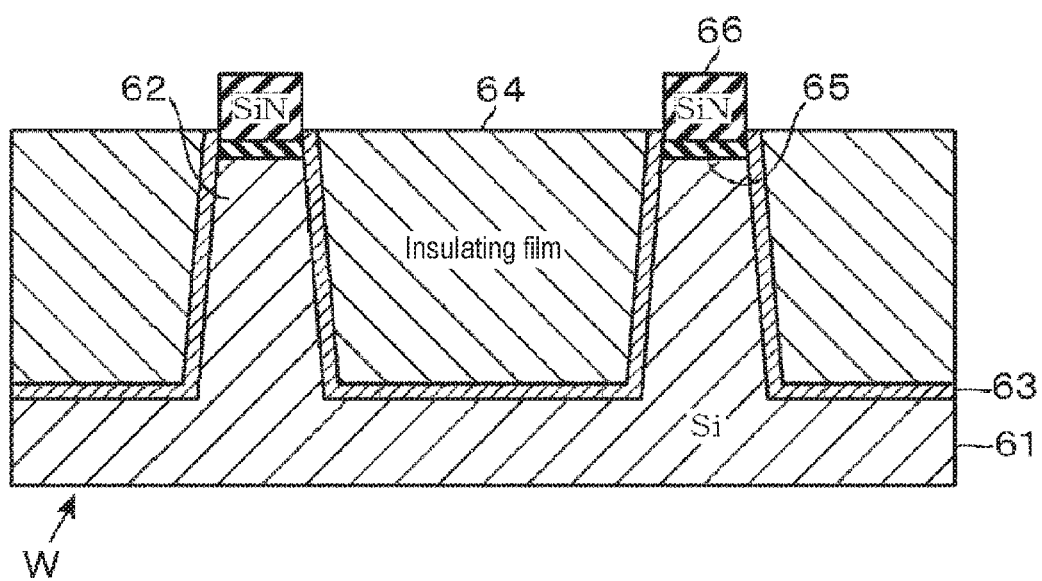
FIG. 5 is a schematic view illustrating a surface of a wafer.

The configuration of the wafer W illustrated in FIG. 4 is just an example, but a wafer W to be processed by the semiconductor manufacturing apparatus 1 is not limited to the above configuration. In addition, since the present disclosure is to restore the characteristics of an oxide film exposed to the plasma as described above, a film to be removed by the plasma etching is not limited to the SiN film. Further, an oxide film exposed to the plasma is not limited to the $SiO_2$ film but may be a carbon-containing silicon oxide film (SiOC film). Further, the oxide film is not limited to a silicon oxide film such as a $SiO_2$ film or a SiOC film, more specifically, an oxide film composed mainly of silicon, but may be a metal oxide film such as, for example, an aluminum oxide ($Al_2O_3$) film, a hafnium oxide ($HfO_2$) film, a zirconium oxide ($ZrO_2$) film, a titanium oxide ($TiO_2$) film, a tantalum oxide ($TaO_5$) film or the like.

In the above embodiment, the etching module 2 is configured as a plasma etching module for forming ICP, but it may be configured as a module for forming capacitively-coupled plasma (CCP) to etch the wafer W with the CCP. Further, in the etching module 2, the fluorine compound is used as a process gas composed of a halogen compound for plasma etching. However, the process gas can be appropriately selected depending on a film to be etched. Further, a process gas containing bromine instead of fluorine, such as a HBr gas or the like, may be used to perform the plasma etching. In this case, it is believed that the electrical characteristics of the oxide film can be restored by desorbing bromine instead of fluorine in the nitrogen annealing module 4.

In addition, in desorbing water and halogen by heating the wafer W, which has been subjected to the processing in the etching module 2, to 450 degrees C. or higher, it is only necessary to prevent a $SiO_2$ film heated to such a relatively high temperature from being modified by reacting with a compound of an atmosphere around the wafer W, or to prevent reaction products from adhering onto the $SiO_2$ film by the reaction of the water or halogen desorbed from the $SiO_2$ film with the compound around the wafer W on the surface of the wafer W. Therefore, in the annealing module 4, without being limited to supplying the $N_2$ gas as described above, another inert gas such as an Ar gas other than the $N_2$ gas may be supplied to the wafer W. Thereafter, the wafer W may be subjected to a heating treatment so that the water and halogen are desorbed. In some embodiments, the wafer W may be heated in a vacuum atmosphere containing no inert gas, a normal pressure atmosphere or a pressurized inert gas atmosphere so that the water and halogen are desorbed.

In the above embodiment, the wafer W has been described to be heated in the etching module 2 to remove by-products generated by the etching performed in the etching module 2. However, the heating of the wafer W may be performed in the nitrogen annealing module 4. Further, the plasma treatment using the halogen gas is not limited to the etching treatment but may be, for example, a treatment such as film formation or surface modification. Further, in the above embodiment, the Al film is formed as a conductive film on the $SiO_2$ film. However, the conductive film may be a metal film other than Al, a polysilicon film other than metal, or the like.

(Evaluation Tests)

Next, Evaluation tests conducted in connection with the present disclosure will be described below.
Evaluation Test 1

In Evaluation test 1, a sacrificial oxide film formed on the surface of a p-type silicon substrate was peeled off and the surface of the substrate was cleaned. Thereafter, the surface of the substrate was oxidized to form a $SiO_2$ film. The film thickness of the $SiO_2$ film was 5 nm to 6 nm. Thereafter, in the etching module 2, the substrate, namely the $SiO_2$ film, was exposed to the above-mentioned plasma. Subsequently, as described above, formation of an Al film on the $SiO_2$ film and an annealing treatment in a hydrogen gas atmosphere were sequentially performed. That is to say, die processing of the substrate in Evaluation test 1 is different from the processing described in the flowchart of FIG. 4 in that the annealing treatment is not performed in the $N_2$ gas atmosphere. After performing a series of processes on the substrate in this manner, an electric field was applied to the Al film and the intensity of the electric field was varied to investigate the characteristics of leakage current of the $SiO_2$ film. Further, as Control test 1, the same substrate processing as in Evaluation test 1 was performed except that the plasma treatment in the etching module 2 was not performed, and then the same measurement was performed on the $SiO_2$ film to investigate the characteristics of leakage current.

Figure 7:
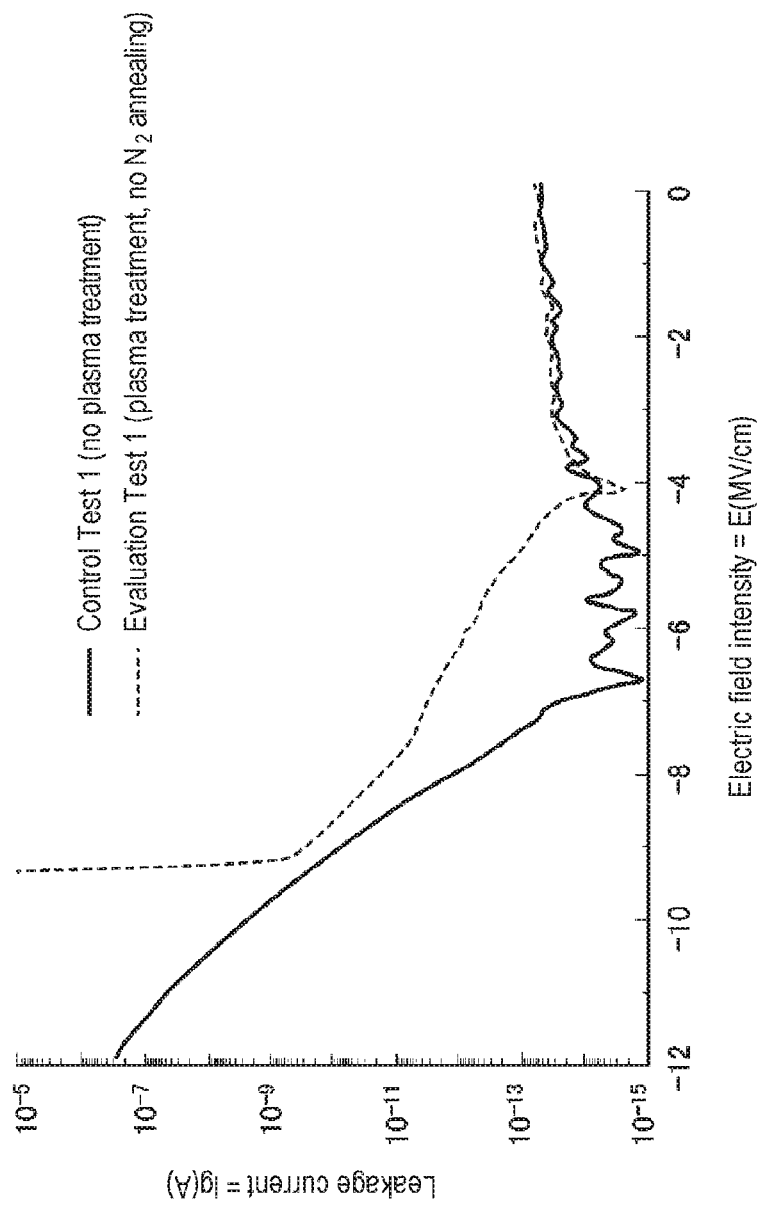
FIG. 7 is a graph showing the results of an Evaluation test.

A graph of FIG. 7 shows the results of Evaluation test 1 and Control test 1. The horizontal axis in the graph represents electric field intensity (denoted by E In FIG. 7, unit: MV/cm), and more specifically, a value obtained by dividing a value (Vg−Vfb, unit: MV), which is obtained by correcting a voltage Vg applied to the Al film to form an electric field with a flat band voltage Vfb, by a film thickness (unit: cm) of an oxide film. The vertical axis in the graph shows measured leakage current (denoted as Ig in FIG. 7, unit: A).

In the graph of FIG. 7, the result of Evaluation test 1 is shown by a dotted waveform and the result of Control test 1 is shown by a solid waveform. The measurement of the leakage current in Evaluation test 1 and the measurement of the leakage current in Control test 1 are respectively performed for a plurality of sites of the substrate. Thus, a plurality of graph waveforms showing the result of Evaluation test 1 and a plurality of graph waveforms showing the result of Control test 1 are acquired. However, depicting all of these waveforms in the figure is a very troublesome task. Therefore, for the sake of simplicity, one waveform acquired in Evaluation test 1 and one waveform acquired in Control test 1 are shown in FIG. 7. For Evaluation tests 2 to 6 to be described later, similar to Evaluation test 1, the measurement of the leakage current was performed plural times on a single substrate and a plurality of graph waveforms was obtained. However, for the sake of convenience in illustration, one of the plurality of graph waveforms is shown in the figure showing the result of each of Evaluation tests 2 to 6.

As can be seen from FIG. 7, comparing values of the leakage current between Evaluation test 1 and Control test 1 when the electric field intensity is an arbitrary value within the range of about 0 MV/cm to about −4 MV/cm, no large difference is observed. However, comparing values of the leakage current when the electric field intensity is an arbitrary value within the range from about −4 MV/cm to about −9 MV/cm, the leakage current in Evaluation test 1 is larger than that in Control test 1. Further, in Evaluation test 1, it can be seen that the leakage current rises sharply when the absolute value of the electric field intensity becomes larger than a value around −9 MV/cm as a boundary. That is to say, it can be seen that the dielectric breakdown of the $SiO_2$ film occurs when an electric field of about −9 MV/cm is applied. For Evaluation test 1, it was also confirmed from a waveform not shown in FIG. 7 that the dielectric breakdown occurred when an electric field of about −8.5 to −10 MV/cm was applied.

In Control test 1, a sharp rise in leakage current as seen in the waveform of Evaluation test 1 was not confirmed at an electric field intensity of 0 MV/cm to −12 MV/cm under measurement. Thus, it can be seen from the result of Evaluation test 1 that the dielectric withstanding voltage decreases and the leakage current increases when the $SiO_2$ film is exposed to the plasma, as described in the Background section of the present disclosure.

Evaluation Test 2

As Evaluation test 2, the substrate was processed in substantially the same manner as in Evaluation test 1 to measure the leakage current. However, the substrate processing in Evaluation test 2 is different from the substrate processing in Evaluation test 1 in that, after exposing the substrate to the plasma and before forming the Al film, the substrate was annealed in the $N_2$ gas atmosphere, as described in the embodiment of the present disclosure. The heating temperature of the substrate in this annealing treatment was 600 degrees C. and the treatment time period was 10 minutes.

Figure 8:
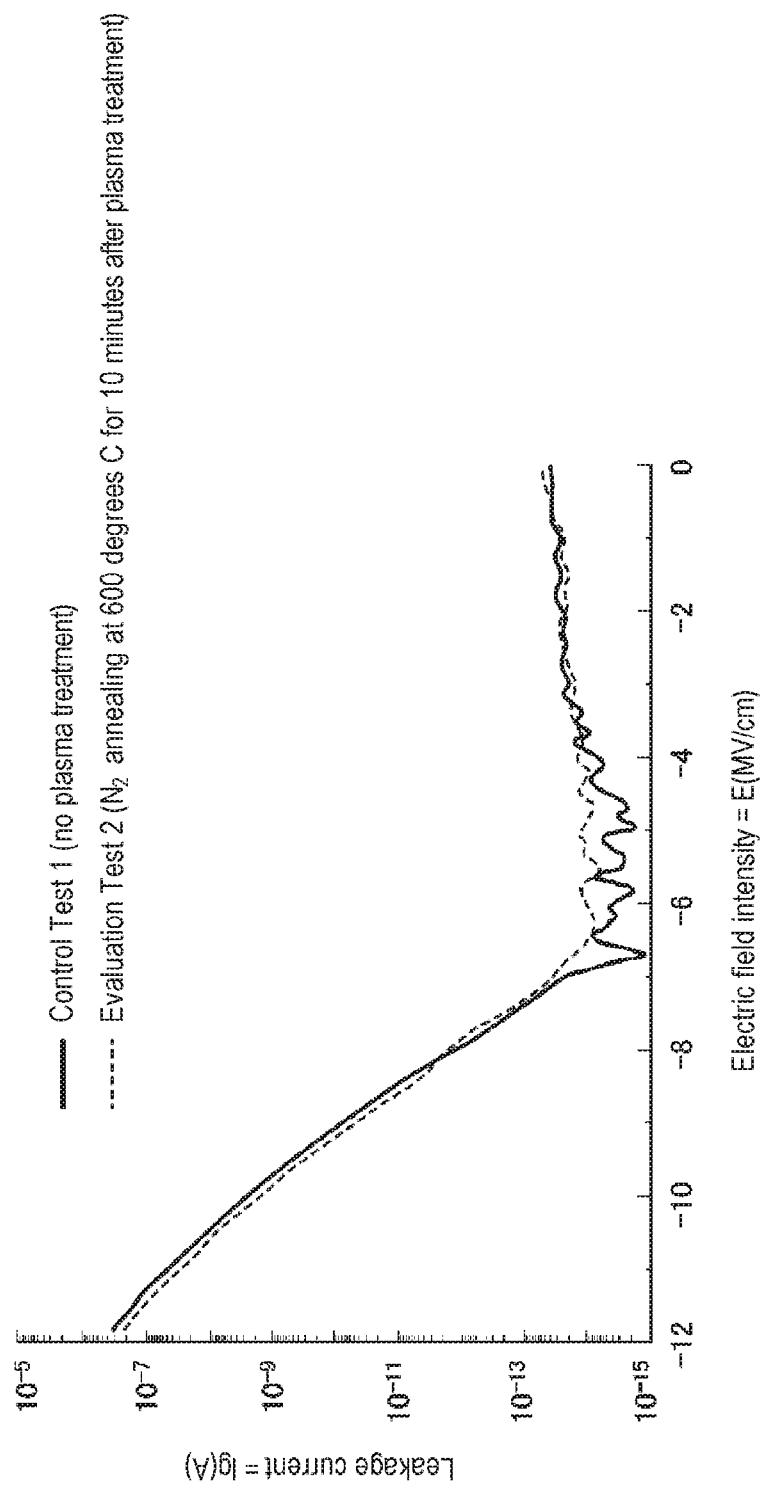
FIG. 8 is a graph showing the results of an Evaluation test.

The result of Evaluation test 2 is shown by a dotted waveform in a graph of FIG. 8. The graph of FIG. 8 shows the relationship between the electric field intensity and the leakage current, similar to the graph of FIG. 7 and also shows the result of Control test 1 by a solid waveform as in the graph of FIG. 7. As shown in FIG. 8, the waveform of the graph of Evaluation test 2 and the waveform of the graph of Control test 1 coincides substantially with each other. That is to say, when an electric field having arbitrary intensity within the range of 0 MV/cm to −12 MV/cm under measurement is applied, the leakage current measured in Evaluation test 2 and the leakage current measured in Control test 1 coincides substantially with each other, and the measurement result of Evaluation test 2 does not show a sharp rise in leakage current which indicates that dielectric breakdown occurs. It can be seen from the result of Evaluation test 2 and the result of Evaluation test 1 that the electrical characteristics of the $SiO_2$ film deteriorated due to the exposure to the plasma are recovered when the $SiO_2$ film is annealed in the $N_2$ gas atmosphere. That is to say, the effects of the present disclosure were confirmed.

Evaluation Test 3

As Evaluation test 3, the substrate was processed in substantially the same manner as in Evaluation test 2 to measure the leakage current, except that the substrate processing in Evaluation test 3 was performed on a plurality of substrates and the annealing treatment in the $N_2$ gas atmosphere was performed at different temperatures for different substrates. Specifically, each substrate was heated to one of 300 degrees C., 400 degrees C. and 500 degrees C. for annealing. In Evaluation test 3, tests in which the annealing treatment was carried out at 300 degrees C., 400 degrees C. and 500 degrees C. are referred to as Evaluation test 3-1, Evaluation test 3-2 and Evaluation test 3-3, respectively. Except for such a difference, Evaluation test 3 was conducted in the same manner as Evaluation test 2. Therefore, a period of time for annealing the substrate is 10 minutes.

Figure 9:
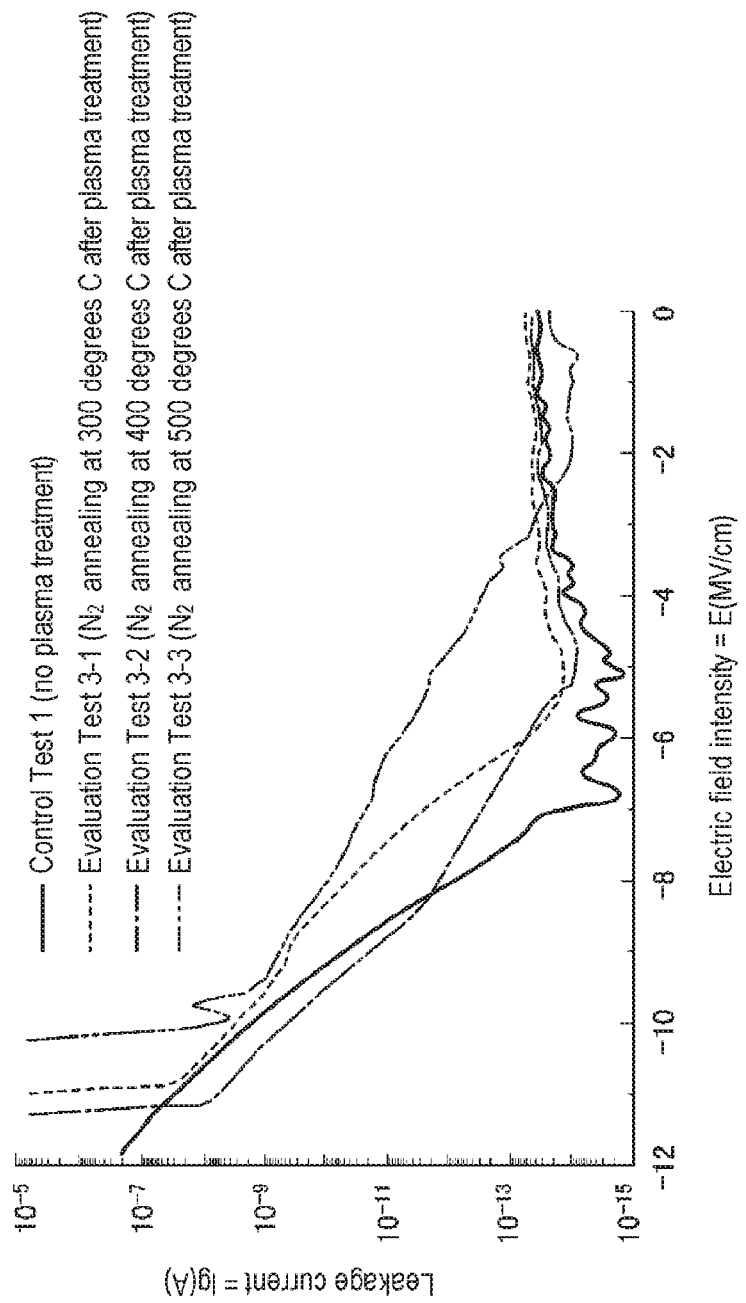
FIG. 9 is a graph showing the results of an Evaluation test.

In a graph of FIG. 9, similar to the graphs of FIGS. 7 and 8 described above, the leakage current and the electric field intensity are set on the vertical axis and the horizontal axis, respectively, and the results of Evaluation tests 3-1, 3-2 and 3-3 are shown by waveforms of a dotted line, a dashed dotted line and a dashed double-dotted line, respectively. Also in FIG. 9, the result of Control test 1 is shown by a solid graph waveform as in FIGS. 7 and 8. Comparing leakage currents corresponding to the electric field intensity of an arbitrary value within the range of about −5 MV/cm to about −8 MV/cm, it can be confirmed from the graph that the leakage currents of Evaluation tests 3-1, 3-2 and 3-3 are larger than the leakage current of Control test 1. In addition, a sharp rise in leakage current, which indicates that the dielectric breakdown observed in Evaluation test 1 occurs, can be confirmed from the respective waveforms of Evaluation tests 3-1, 3-2 and 3-3. From the results of Evaluation test 3 and Evaluation test 2, it is considered that the degree of restoration of the electrical characteristics of the $SiO_2$ film is influenced by the temperature of the annealing treatment in the $N_2$ gas atmosphere.

Evaluation Test 4

As Evaluation test 4, the substrate was processed in substantially the same manner as in Evaluation test 2 to measure the leakage current. Evaluation test 4 is different from Evaluation test 2 in that the annealing treatment in the $N_2$ gas atmosphere was performed with different processing time periods set for different substrates. Specifically, the processing time period for annealing was set to 10 minutes, 15 minutes or 20 minutes. In this Evaluation test 4, tests in which the annealing time period is set to 10 minutes, 15 minutes and 20 minutes are referred to as Evaluation test 4-1, Evaluation test 4-2 and Evaluation test 4-3, respectively. In the annealing treatment of Evaluation test 4, the heating temperature of each substrate was 500 degrees C.

Figure 10:
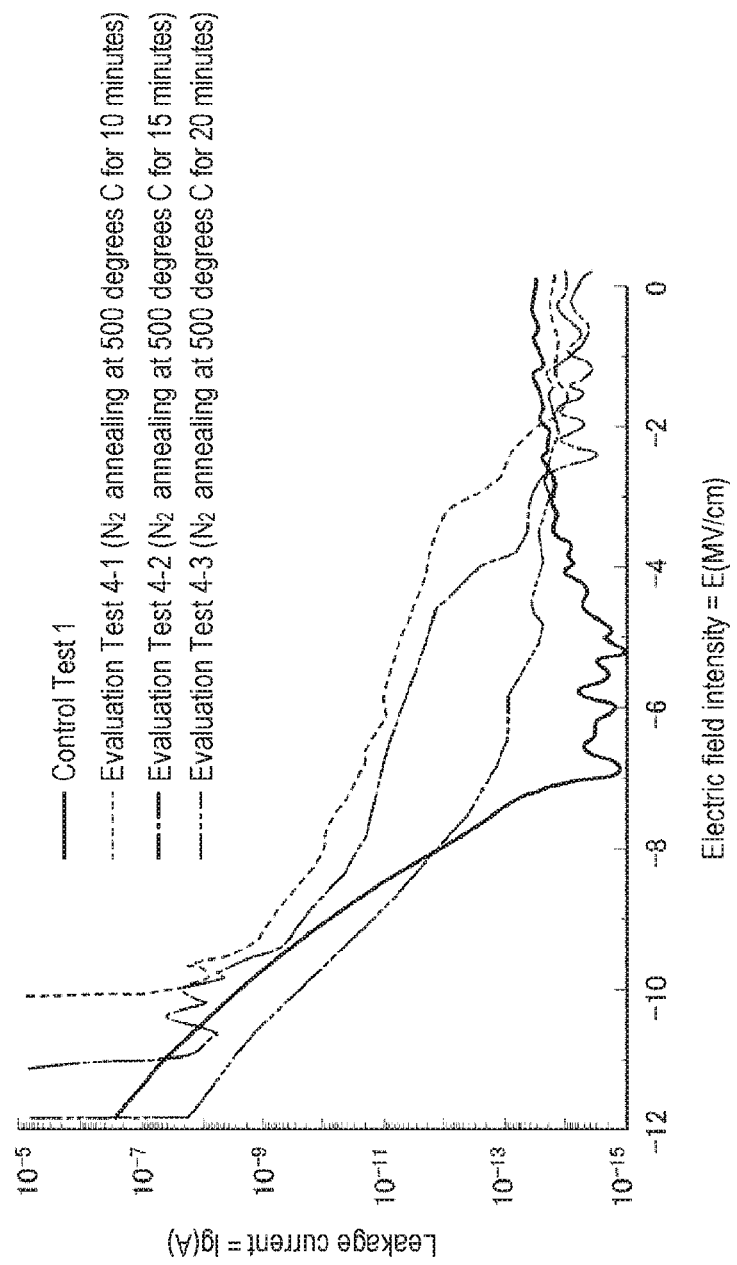
FIG. 10 is a graph showing the results of an Evaluation test.

In a graph of FIG. 10, similar to the graphs described above, the leakage current and the electric field intensity are set on the vertical axis and the horizontal axis, respectively, and the results of Evaluation tests 4-1, 4-2 and 4-3 are shown by waveforms of a dotted line, a dashed dotted line and a dashed double-dotted line, respectively, in the graph of FIG. 10. In addition, the result of Control test 1 is shown by a solid waveform as in the graphs of the figures described above.

Regarding the leakage current with respect to the electric field intensity of an arbitrary value within the range of about 0 MV/cm to about −2.5 MV/cm, no large difference is observed between Evaluation tests 4-1 to 4-3 and Control test 1. However, the leakage current with respect to the electric field intensity of an arbitrary value within the range of the electric field strength of about −2.5 MV to about −10 MV is larger in Evaluation tests 4-1 to 4-3 than in Control test 1. Between Evaluation tests 4-1 to 4-3, it was confirmed that the leakage current in Evaluation test 4-3 was the smallest and the leakage current in Evaluation test 4-1 is the largest. In other words, the longer the annealing time period, the smaller the leakage current.

In addition, a sharp rise in leakage current indicating the occurrence of dielectric breakdown occurs within the range of −9 MV/cm to −10 MV/cm in Evaluation test 4-1, within the range of −10 MV/cm to −11 MV/cm in Evaluation test 4-2, and within the range of −11 MV/cm to −12 MV/cm in Evaluation test 4-3. That is to say, among Evaluation tests 4-1 to 4-3, the substrate in a test for which the annealing time period is longer has a higher dielectric withstanding voltage. From this result, it is considered that the degree of restoration of the electric characteristics of the $SiO_2$ film increases with the increase in the annealing time period.

Evaluation Test 5

Figure 11:
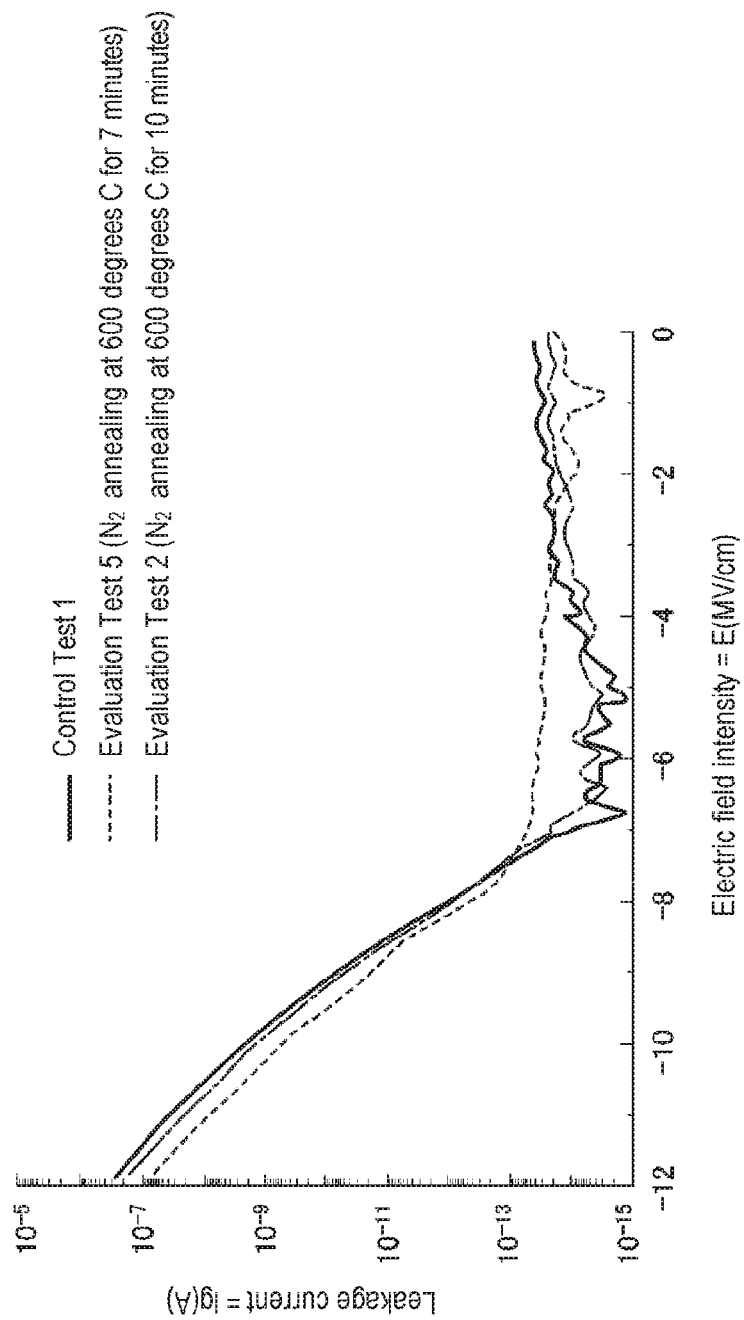
FIG. 11 is a graph showing the results of an Evaluation test.

In Evaluation test 5, the substrate was processed in substantially the same manner as in Evaluation test 2 to measure the leakage current. However, the annealing time period in the N$_2$ gas atmosphere was set to 7 minutes which is shorter than that of Evaluation test 2. Except for the annealing time period, the substrate processing of Evaluation test 5 is the same as that of Evaluation test 2. Therefore, the annealing temperature of Evaluation test 5 is 600 degrees C. A graph of FIG. 11 shows the result of Evaluation test 5 with the leakage current and the electric field intensity set on the vertical axis and the horizontal axis, respectively, similar to the above-described graphs. In FIG. 11, the result of Evaluation test 5 is shown by a dotted graph waveform. In addition, in FIG. 11, for comparison with the result of Evaluation test 5, the result of Control test 1 and the result of Evaluation test 2 are shown by graph waveforms of a solid line and a dashed dotted line, respectively.

Regarding the leakage current with respect to the electric field intensity of an arbitrary value within the range of 0 MV/cm to −11 MV/cm, no large difference is observed between Evaluation test 5 and Control test 1. Although not shown in the waveform shown In FIG. 11, some of the waveforms acquired in Evaluation test 5 showed a sharp rise in the leakage current, similar to Evaluation test 1. However, the sharp rise in the leakage current appeared within the range of −11 MV/cm to −12 MV/cm. That is to say, dielectric breakdown did not occur unless a relatively large electric field is applied. Accordingly, it was confirmed in Evaluation test 5 that the electrical characteristics of the SiO$_2$ film were restored.

In addition, comparing the result of Evaluation test 2 with the result of Evaluation test 5, the sharp rise in leakage current shown in Evaluation test 5 as described above was not observed in Evaluation test 2. Therefore, the electrical characteristics of the SiO$_2$ film was restored more in Evaluation test 2 than in Evaluation test 5. That is to say, it can be also seen from the results of Evaluation tests 2 and 5 that the longer annealing time period provides more restoration of the electrical characteristics of the SiO$_2$ film.

Evaluation Test 6

As Evaluation test 6, similar to Evaluation test 1, the formation of the SiO$_2$ film and the plasma treatment were sequentially performed on the substrate. However, in this Evaluation test 6, after the plasma treatment, the annealing treatment in the N$_2$ gas atmosphere, the formation of the Al film and the annealing treatment in the hydrogen gas atmosphere were not performed. Then, the substrate subjected to the plasma treatment was measured by thermal desorption gas spectroscopy (TDS) to detect a gas desorbed when the substrate was heated. In the TDS of Evaluation test 6, the temperature of the substrate was changed during the measurement.

Figure 12:
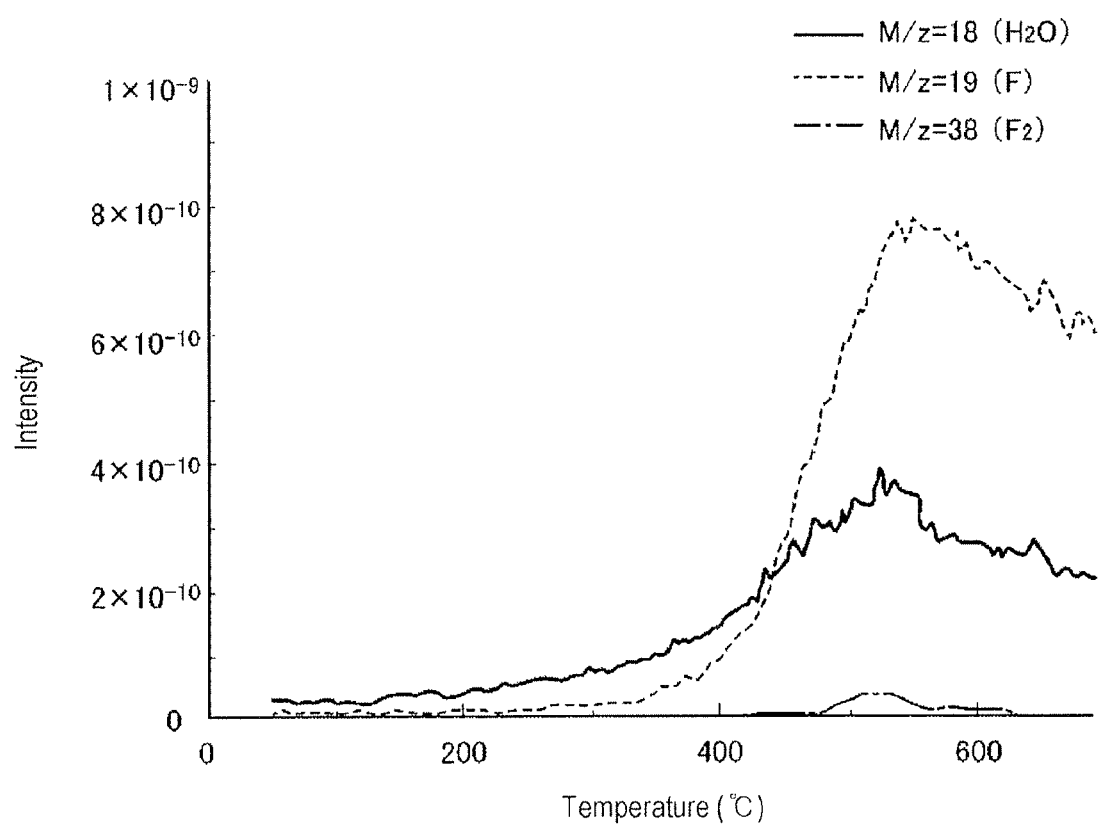
FIG. 12 is a graph showing the results of an Evaluation test.

A graph of FIG. 12 shows the result of this Evaluation test 6. In the graph of FIG. 12, the vertical axis represents an intensity of a measured signal and the horizontal axis represents a substrate temperature (unit: degrees C.). As shown in the graph, it was detected by TDS that gases with mass-to-charge ratios (M/z) of 18, 19 and 38, namely consisting respectively of H$_2$O, F and F$_2$, were desorbed from the substrate. In the graph of FIG. 12, the spectra for H$_2$O, F and F$_2$ are indicated by a solid line, a dotted line and a dashed dotted line, respectively.

It can be seen from the graph of FIG. 12 that the measured intensities of H$_2$O, F and F$_2$, namely the amounts of gases desorbed from the substrate, increase with an increase in the temperature of the substrate. It can be also seen from the graph that, at a temperature lower than 450 degrees C., the amount of desorption of H$_2$O and F is relatively small and desorption of F$_2$ hardly occurs. However, it can be confirmed that, at a temperature of 450 degrees C. or higher, the amount of desorption of H$_2$O and F is relatively large and F$_2$ is also desorbed. It is inferred from the result of Evaluation test 6 that the electrical characteristics of the SiO$_2$ film deteriorate due to the entry of H$_2$O, F and F$_2$ into the SiO$_2$ film by the plasma treatment and the electrical characteristics of the SiO$_2$ film are restored when the H$_2$O, F and F$_2$ are desorbed by the annealing treatment of the substrate after the plasma treatment.

Evaluation Test 7

Figure 13:
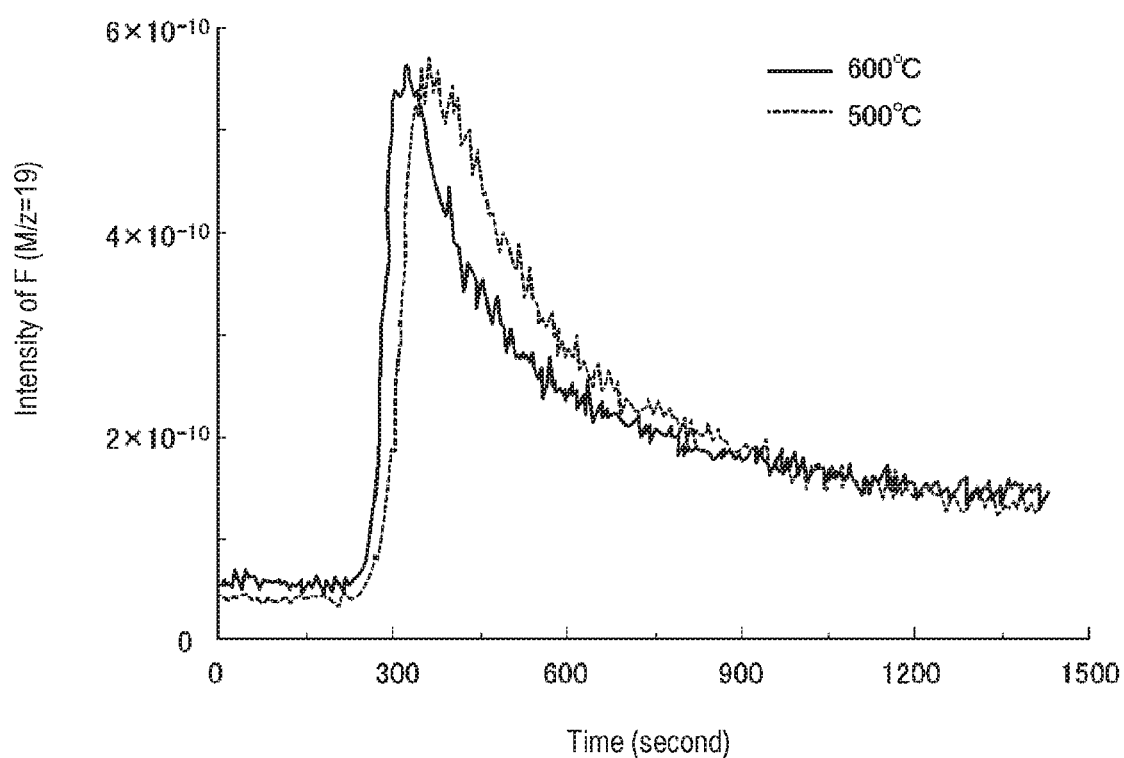
FIG. 13 is a graph showing the results of an Evaluation test.

As Evaluation test 7, a plurality of substrates processed in the same manner as in Evaluation test 6 were measured by TDS to acquire the spectrum for M/z=19, namely F. In the TDS of Evaluation test 7, a temperature at which the substrates are heated was changed for each measurement. In a graph of FIG. 13, the spectra of F obtained when the substrates are heated at 600 degrees C. and 500 degrees C. in TDS are indicated by a solid line and a broken line, respectively. In the graph of FIG. 13, the vertical axis represents a signal intensity of F and the horizontal axis represents a period of time (unit: second) elapsed from the start of heating of the substrates.

As can be seen from the graph of FIG. 13, a peak of the waveform at the substrate temperature of 500 degrees C. appears with a small time delay as compared with a peak of the waveform at the substrate temperature of 600 degrees C. The waveforms have substantially the same shape except that the timings at which the peaks appear in this manner are different from each other. Therefore, it is inferred that, even when the temperature of the annealing treatment performed in an inert gas atmosphere or a vacuum atmosphere is low, F can be desorbed by increasing the annealing time period. This inference is consistent with the result that the restoration of the electrical characteristics of the SiO$_2$ film in Evaluation test 4 increases with the increase in the annealing time period.

However, if the annealing time period in an inert gas atmosphere or a vacuum atmosphere is too long, the throughput of the semiconductor manufacturing apparatus 1 is greatly reduced, which is unsuitable for practical use. In Evaluation test 4-3 shown in FIG. 10, when the annealing treatment is performed at 500 degrees C. for 20 minutes, the restoration of the electrical characteristics of the SiO$_2$ film which is practically effective is manifested. Further, since the treatment time of 20 minutes does not prevent practical use, a period of time slightly longer than the treatment time is not problematic. Further, as described in the result of Evaluation test 6, when the substrate is heated at a temperature of 450 degrees C. or higher, desorption of each gas occurs at a relatively high rate. From the results of these tests, it is considered that the temperature at which the substrate is heated to desorb water and halogen is effective for 450 degrees C. or higher, which causes no practical problem.

Evaluation Test 8

In Evaluation test 8, similar to Evaluation tests 6 and 7, the formation of the SiO$_2$ film and the plasma treatment were sequentially performed on the substrate, and then the annealing treatment was performed in a vacuum. Such series of processes was performed for a plurality of substrates and the annealing treatment was performed in a vacuum at different temperatures for different substrates. Specifically, the annealing treatment was performed at 600 degrees C. or 500 degrees C. After the series of processes, TDS was performed after each substrate was exposed to the air atmosphere for 24 hours. In this TDS, as in Evaluation test 6, the substrate temperature was changed during the measurement. In Evaluation test 8, tests in which the annealing temperature is 600 degrees C. and 500 degrees C. are referred to as Evaluation test 8-1 and Evaluation test 8-2, respectively. In both Evaluation tests 8-1 and 8-2, the annealing time period is 10 minutes.

Figure 14:
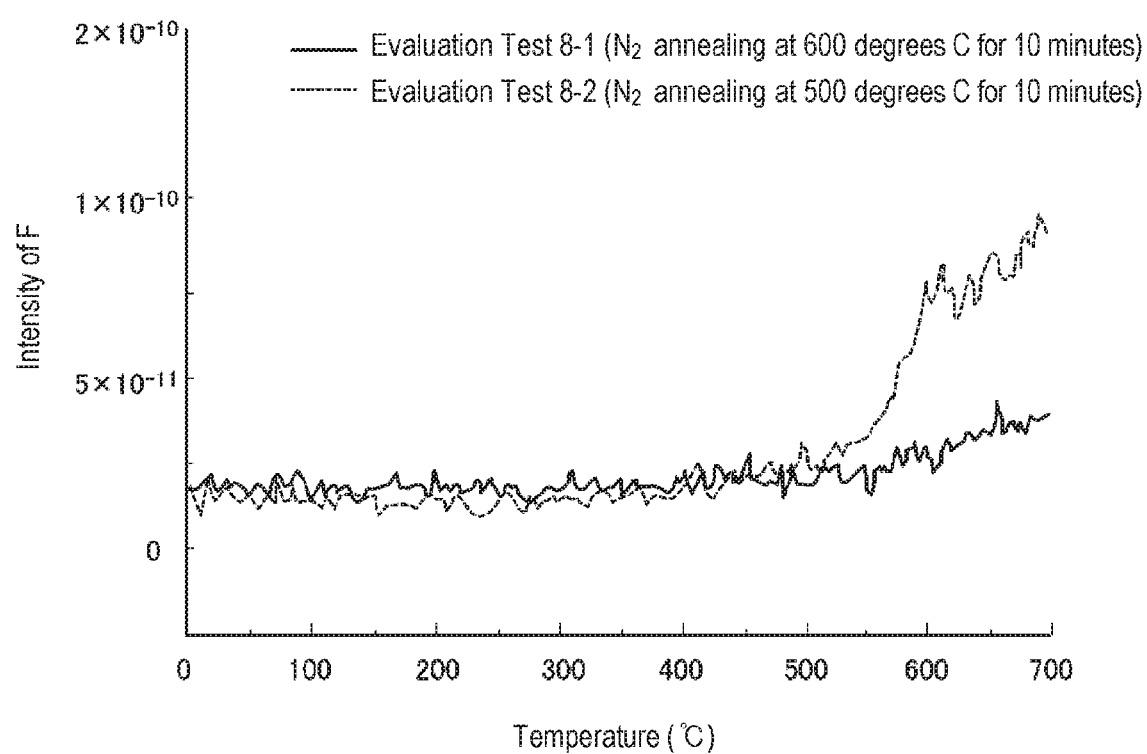
FIG. 14 is a graph showing the results of an Evaluation test.
Figure 15:
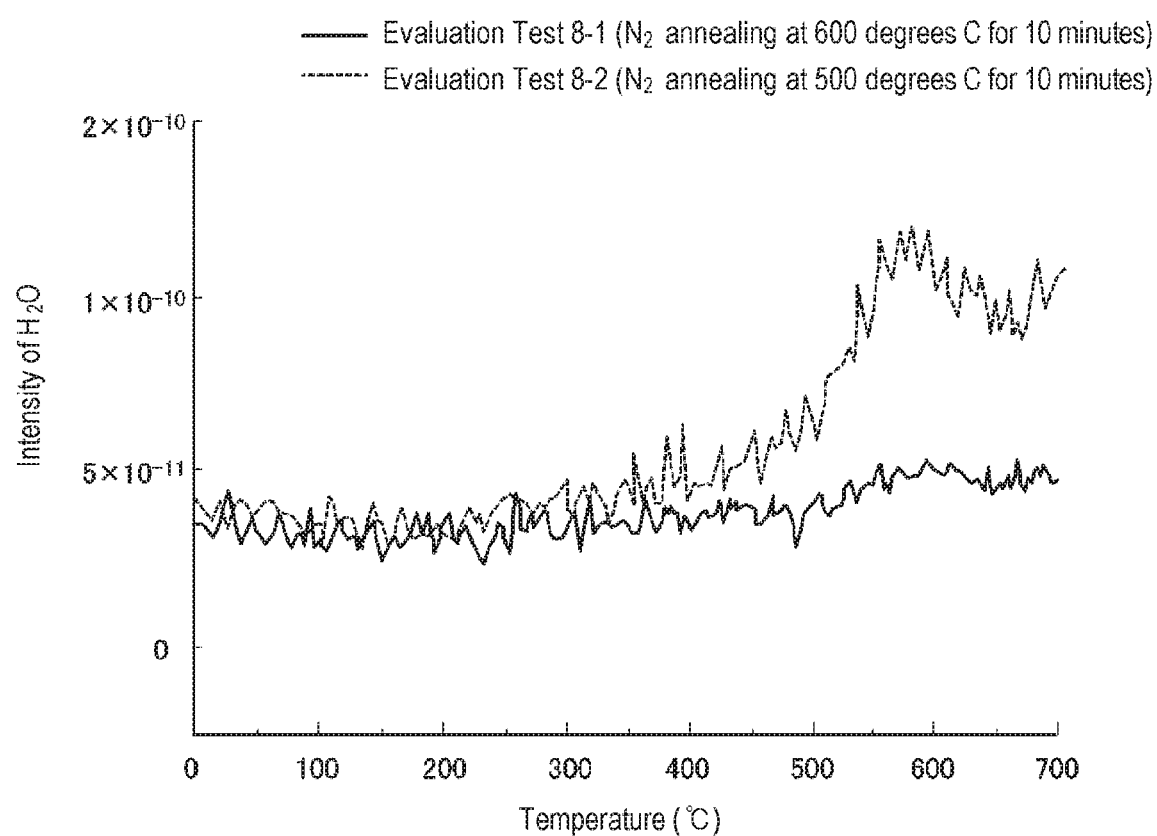
FIG. 15 is a graph showing the results of an Evaluation test.

A graph of FIG. 14 and a graph of FIG. 15 show a spectrum for F and a spectrum for $H_2O$ obtained by Evaluation test 8, respectively. In each of the graphs of FIGS. 14 and 15, the spectra of Evaluation tests 8-1 and 8-2 are indicated by a solid line and a dotted line, respectively. The vertical axis and the horizontal axis of each graph represent the intensity of a measured signal and the substrate temperature (unit: degrees C.) applied at the time of measurement by TDS.

As can be seen from the result of Evaluation test 8-1, the intensity of F and the intensity of $H_2O$ are shifted to have relatively low values while the substrate temperature is being changed within the range of 0 to 700 degrees C., and no large variations are observed. In addition, as can be seen from the spectrum of F of Evaluation test 8-2, when the substrate temperature is 500 degrees C. or higher, the intensity of F is higher than that when the substrate temperature is lower than 500 degrees C. Further, as can be seen from the spectrum of $H_2O$ of Evaluation test 8-2, when the substrate temperature is 400 degrees C. or higher, the intensity of $H_2O$ is higher than that when the substrate temperature is lower than 400 degrees C.

It can be seen from these results that F and $H_2O$ were sufficiently desorbed from the $SiO_2$ film in the annealing treatment in which the substrate temperature in Evaluation test 8-1 was 600 degrees C., and F and $H_2O$ were not sufficiently desorbed from the $SiO_2$ film in the annealing treatment in which the substrate temperature in Evaluation test 8-2 was 500 degrees C. From the result of Evaluation test 8 and the results of Evaluation tests 2 and 3, it is inferred that the F and $H_2O$ are factors that deteriorate the electrical characteristics of the $SiO_2$ film, and that the electrical characteristics of the $SiO_2$ film can be restored by heating the substrate after the plasma treatment so that the F and $H_2O$ can be desorbed from the $SiO_2$ film.

What is claimed is:

1. A method of processing a substrate, comprising:
   processing a substrate on which a silicon oxide film or a metal oxide film is formed and an upper film is stacked on the silicon oxide film or the metal oxide film, with plasma obtained by plasmarizing a process gas composed of a halogen compound to etch away the upper film;
   subsequently, heating the substrate to remove by-products generated in the processing the substrate by sublimation; and
   subsequently, heating the substrate at a temperature of 450 degrees C. or higher in an inert gas atmosphere or a vacuum atmosphere in a state where a surface of the silicon oxide film or the metal oxide film from which the upper film is removed by the etching is exposed.

2. The method of claim 1, further comprising: after the heating the substrate at the temperature of 450 degrees C. or higher, forming a conductive film on the silicon oxide film or the metal oxide film.

3. The method of claim 1, wherein the halogen compound is a compound containing fluorine.

4. The method of claim 1, wherein the processing a substrate includes etching away an upper film stacked on the silicon oxide film or the metal oxide film.

5. The method of claim 4, wherein the upper film is a silicon nitride film.

6. The method of claim 1, wherein the silicon oxide film or the metal oxide film is a gate oxide film of a transistor.

\* \* \* \* \*